(12) United States Patent
Allen et al.

(10) Patent No.: US 11,393,810 B2
(45) Date of Patent: Jul. 19, 2022

(54) ARRAY APPARATUS AND ASSOCIATED METHODS

(71) Applicant: Nokia Technologies Oy, Espoo (FI)

(72) Inventors: Mark Allen, Great Cambourne (GB); Martti Voutilainen, Espoo (FI); Sami Kallioinen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 951 days.

(21) Appl. No.: 16/093,217

(22) PCT Filed: Mar. 15, 2017

(86) PCT No.: PCT/FI2017/050169
§ 371 (c)(1),
(2) Date: Oct. 12, 2018

(87) PCT Pub. No.: WO2017/182696
PCT Pub. Date: Oct. 26, 2017

(65) Prior Publication Data
US 2021/0217745 A1  Jul. 15, 2021

(30) Foreign Application Priority Data

Apr. 19, 2016 (EP) .................................. 16166037

(51) Int. Cl.
| | |
|---|---|
| *H04N 5/369* | (2011.01) |
| *H04N 5/374* | (2011.01) |
| *H04N 5/3745* | (2011.01) |
| *H04N 5/378* | (2011.01) |
| *H01L 27/02* | (2006.01) |
| *H03K 17/16* | (2006.01) |
| *H04N 5/367* | (2011.01) |

(52) U.S. Cl.
CPC ....... *H01L 27/0255* (2013.01); *H03K 17/162* (2013.01); *H04N 5/367* (2013.01)

(58) Field of Classification Search
None
See application file for complete search history.

(56) References Cited

U.S. PATENT DOCUMENTS

| | | | |
|---|---|---|---|
| 3,714,433 A | 1/1973 | Kobayashi | .................... 250/83.6 |
| 7,362,609 B2 * | 4/2008 | Harrison | ............. H01L 21/8213 365/177 |

(Continued)

*Primary Examiner* — Kenneth B Wells
(74) *Attorney, Agent, or Firm* — Harrington & Smith

(57) ABSTRACT

An apparatus including an array of field-effect transistors, each field-effect transistor including a channel, source and drain electrodes, and a gate electrode configured to enable the flow of electrical current to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array, and wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits the magnitude of the leakage current.

20 Claims, 9 Drawing Sheets

(56) References Cited

U.S. PATENT DOCUMENTS

| | | | |
|---|---|---|---|
| 2012/0138919 A1 | 6/2012 | Lan et al. | 257/43 |
| 2013/0241603 A1 | 9/2013 | Chen et al. | 327/109 |
| 2014/0103413 A1 | 4/2014 | Jin et al. | 257/292 |
| 2015/0022211 A1* | 1/2015 | Du | G09G 3/006 |
| | | | 324/414 |

* cited by examiner

JFET (n-type)

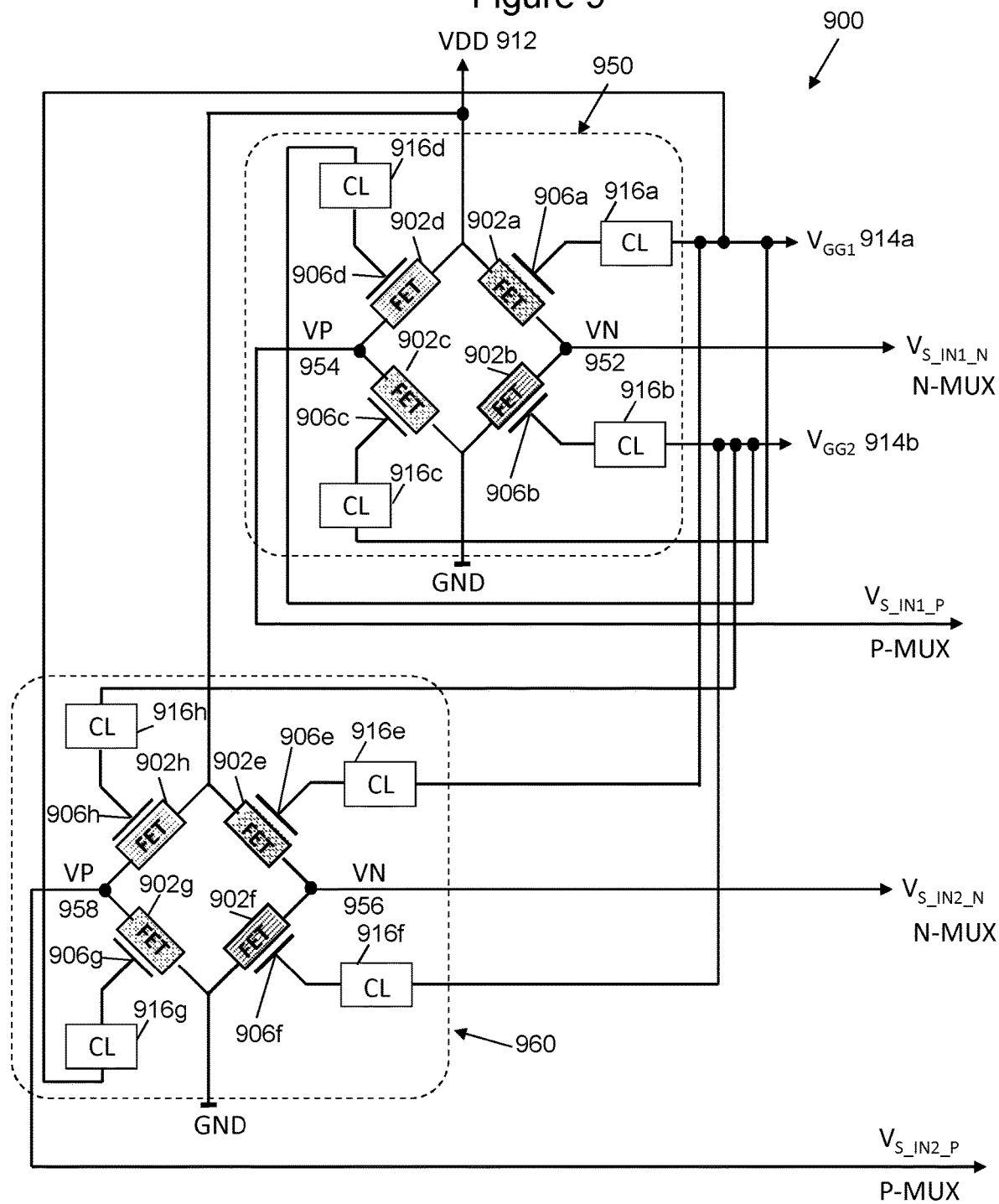

Figure 10

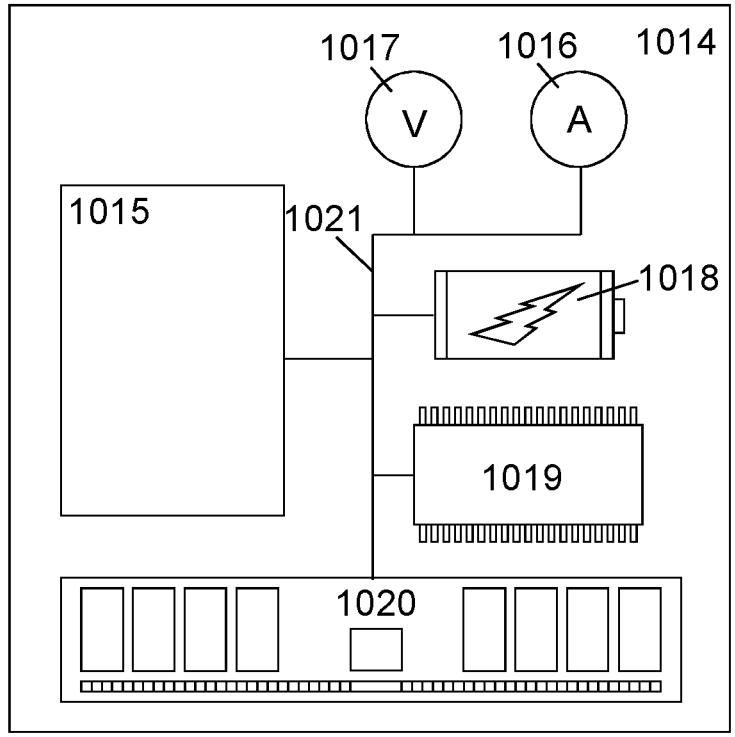

For an apparatus comprising an array of field-effect transistors, each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array -

Coupling a respective two-terminal current-limiting diode to each gate electrode such that, in the event that a defect in the dielectric material of a particular field-effect transistor allows a leakage current to flow between the channel and gate electrode of that field-effect transistor, the respective two-terminal current-limiting diode limits the magnitude of the leakage current so that the other field-effect transistors in the array are substantially unaffected by the leakage current.

Figure 12

1200 — For an apparatus comprising an array of field-effect transistors, each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array, and wherein a respective two-terminal current-limiting diode is coupled to each gate electrode such that, in the event that a defect in the dielectric material of a particular field-effect transistor allows a leakage current to flow between the channel and gate electrode of that field-effect transistor, the respective two-terminal current-limiting diode limits the magnitude of the leakage current so that the other field-effect transistors in the array are substantially unaffected by the leakage current -

Detecting the flow of electrical current through the channel of one or more field-effect transistors of the array.

Figure 13

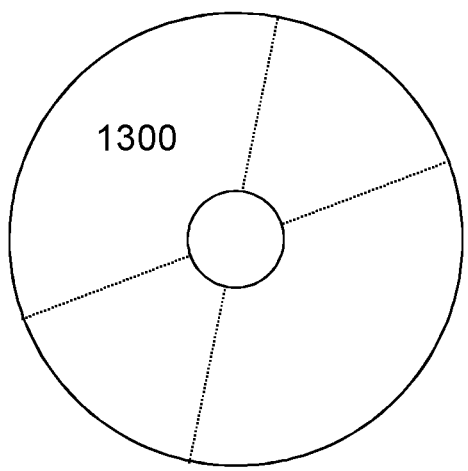

ARRAY APPARATUS AND ASSOCIATED METHODS

This patent application is a U.S. National Stage application of International Patent Application Number PCT/FI2017/050169 filed Mar. 15, 2017, which is hereby incorporated by reference in its entirety, and which claims priority to EP application 16166037.8 filed Apr. 19, 2016.

TECHNICAL FIELD

The present disclosure relates to component arrays, associated methods and apparatus. Certain examples relate to sensors for, e.g. electromagnetic radiation detection. Certain examples concern an apparatus comprising an array of field-effect transistors, wherein a respective two-terminal current-limiting component (e.g. diode) is coupled to the gate electrode of each field-effect transistor. Some examples may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed examples may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new sensor arrays, such as arrays which can be used as photodetectors.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising an array of field-effect transistors, each field-effect transistor comprising a channel, source and drain electrodes configured to enable a flow of electrical current through the channel, and a gate electrode configured to enable the flow of electrical current (through the channel) to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array, and wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits the magnitude of the leakage current so that the other field-effect transistors in the array are substantially unaffected by the leakage current.

The current-limiting component may be considered to be a current-limiting diode, in specific embodiments. For example, current-limiting diode functionality can be implemented by JFET technology as typical commercial current-limiting diode (CLD). Current-limiting diode functionality can also be implemented by transistors and resistors (FIG. 2a, 2b, 2c, FIG. 4, FIG. 7).

The array may comprise two or more field-effect transistors.

Each gate electrode may be connected to a common gate terminal. Each two-terminal current-limiting component may be coupled between a respective gate electrode and the common gate terminal.

The drain electrodes of the field-effect transistors may each be connected to a common drain terminal. In other embodiments, the source electrodes can be connected to a common ground and the drain electrodes can be driven by a multiplexer.

The source electrodes of the field-effect transistors may each be connected to respective inputs of a multiplexer, the multiplexer configured to allow for signals from the field-effect transistors to be read out.

Each two-terminal current-limiting component may comprise first and second current-limiting components connected in parallel, the first and second current-limiting components configured to allow the leakage current to flow in opposite directions such that the magnitude of the leakage current can be limited regardless of whether positive or negative gate voltages are applied to the gate electrode of the corresponding field-effect transistor.

The apparatus may further comprise a respective low pass filter coupled to each gate electrode, the respective low pass filters configured to reduce noise associated with the leakage current.

Each low pass filter may be connected between the gate electrode and the two-terminal current-limiting component of the respective field-effect transistor.

Each low pass filter may comprise a conductor (or metal-insulator-metal capacitor) on either side of the two-terminal current-limiting component of the respective field-effect transistor, each conductor having a parasitic capacitance relative to ground which is large enough to reduce the noise associated with the leakage current.

Each field-effect transistor may comprise a functionalising material configured to interact with a physical stimulus to cause a detectable change in the flow of electrical current through the channel which is indicative of one or more of the presence and magnitude of the physical stimulus.

The functionalising material of at least one of the field effect transistors may comprise a plurality of quantum dots configured to generate electron-hole pairs on exposure to incident electromagnetic radiation to produce the detectable change in the flow of electrical current through the channel.

The field-effect transistors may be arranged such that the change in the flow of electrical current is converted into a corresponding voltage signal.

The field-effect transistors may be arranged to form one or more half-bridge circuits configured to convert the change in the flow of electrical current into a single-ended voltage signal.

The field-effect transistors may be arranged to form one or more full-bridge circuits configured to convert the change in the flow of electrical current into a differential voltage signal.

Each bridge circuit may comprise first and second field-effect transistors configured such that the interaction with the physical stimulus causes an increase and decrease in the flow of electrical current through the channels of the first and second field-effect transistors respectively.

Each two-terminal current-limiting component may comprise:
an n-type junction-gate field-effect transistor, or
an n-type metal-oxide-semiconductor field-effect transistor;
comprising a gate, a source, and a drain electrode, the gate and source electrodes coupled together with a resistor, the resistor configured to determine the maximum allowed current flow through the two-terminal current-limiting component.

The field-effect transistors may be arranged to form a one, two or three dimensional array.

The channel of each field-effect transistor may comprise graphene.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, an optical imaging device, an infrared detector, an X-ray detector, a biometric identification device, an electronic nose, a sensor, an electromagnetic radiation sensor, a chemical sensor, a heat sensor, a humidity sensor, and a module for one or more of the same.

According to a further aspect, there is provided a method of making an apparatus comprising an array of field-effect transistors,
each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array,
the method comprising coupling a respective two-terminal current-limiting component to each gate electrode such that, in the event that a defect in the dielectric material of a particular field-effect transistor allows a leakage current to flow between the channel and gate electrode of that field-effect transistor, the respective two-terminal current-limiting component limits the magnitude of the leakage current so that the other field-effect transistors in the array are substantially unaffected by the leakage current.

According to a further aspect, there is provided a method of using an apparatus,
the apparatus comprising an array of field-effect transistors, each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode, wherein the gate electrode of each field-effect transistor is connected in parallel to the gate electrodes of the other field-effect transistors in the array, and wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits the magnitude of the leakage current so that the other field-effect transistors in the array are substantially unaffected by the leakage current;
the method comprising detecting the flow of electrical current through the channel of one or more field-effect transistors of the array.

The steps of any method disclosed herein do not have to be performed in the exact order disclosed, unless explicitly stated or understood by the skilled person.

In a further aspect there is provided a computer program comprising computer code configured to perform any method claimed or described herein. Corresponding computer programs for implementing one or more steps of the methods disclosed herein are also within the present disclosure and are encompassed by one or more of the described examples.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, examples or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 9 shows an array of FETs connected to two-terminal current-limiting diodes in full-bridge configurations according to the present disclosure;

FIG. 10 shows another example of the present apparatus;

FIG. 11 shows a method of making the present apparatus;

FIG. 12 shows a method of using the present apparatus; and

FIG. 13 shows a computer-readable medium comprising a computer program configured to perform, control or enable a method described herein.

DESCRIPTION OF SPECIFIC ASPECTS/EXAMPLES

Figure 1:
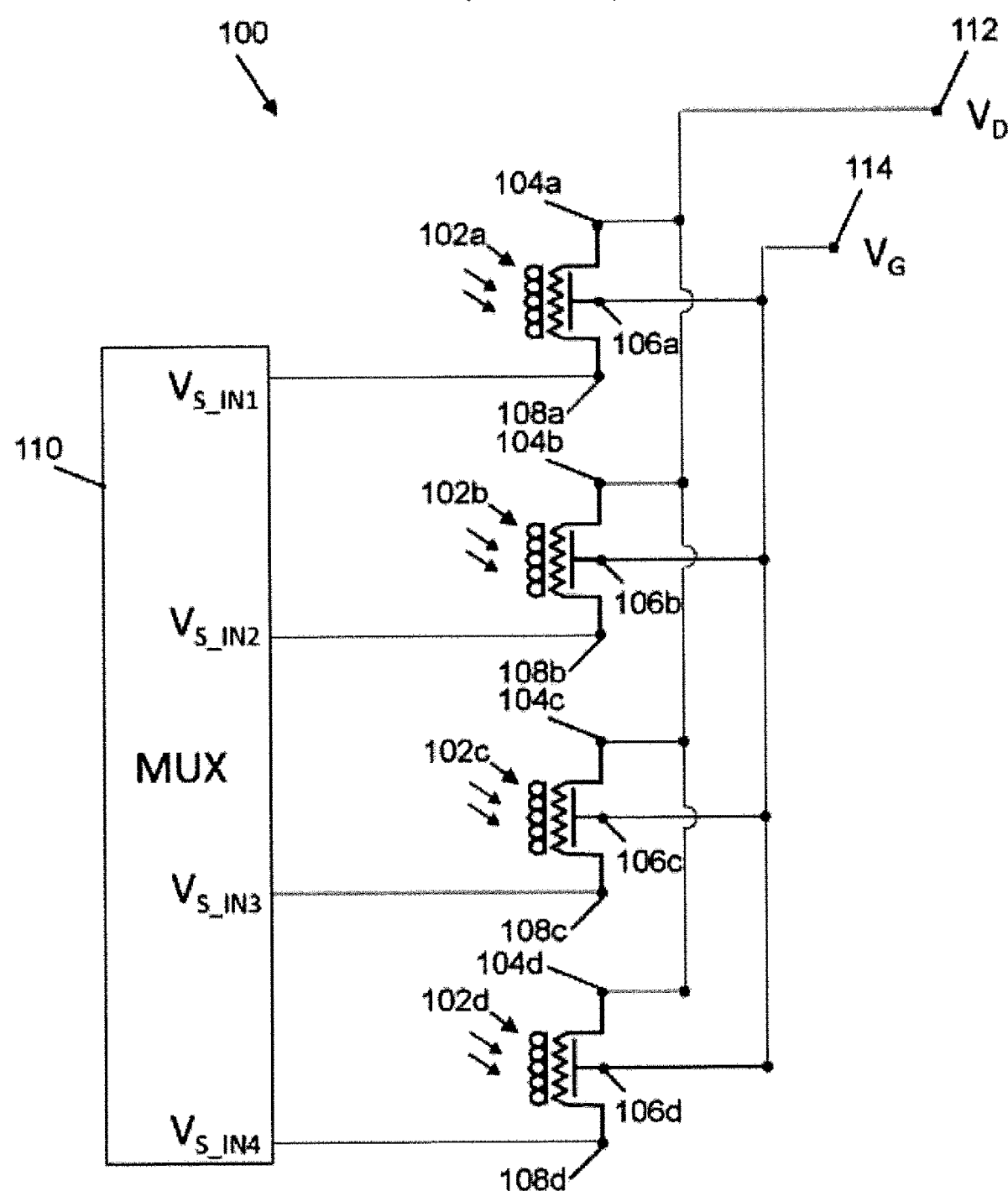
FIG. 1 shows an array of field-effect transistors (FETs)

Certain examples described herein relate to sensor arrays. In such arrays the sensing may be performed using field-effect transistors (FETs). For example, a photodetector may be realised using an array of quantum-dot graphene FETs (QD GFETs).

For FET arrays, such as QD GFET arrays, the gate electrodes of the FETs may be connected in parallel. In this way the FETs may be biased from a common source. In the event of a faulty FET, current may "leak" from the faulty FET and affect the performance of the other FETs in the array. Certain examples disclosed herein may reduce problems caused by such current leaks.

A FET may have a dielectric layer located between the channel and gate electrode to reduce current flow between the channel and gate electrode. With FET arrays, such as large-area GFET arrays, it is possible that some pinholes or other defects exist in the dielectric layers of one or more of the FETs in the array. Such defects may lead to current being able to flow between the channel and gate electrodes. Such a current may be termed a gate leakage current.

In examples where the FET is a graphene FET (GFET), typically at least two contact electrodes (a drain electrode and a source electrode) contact a graphene channel. The channel can be gated by applying a voltage to a gate electrode separated from the channel via a gate dielectric. Various gate dielectric materials may be used including Silicon dioxide (SiO2), Aluminium oxide (Al2O3), and Silicon nitride (SiN). The gate voltage required to induce a given electric field at the graphene channel scales linearly with the thickness of the dielectric layer. For example, if the gate dielectric has thickness of 25 nm, a gate voltage operating range from −5V to +5V is typically sufficient to capture the Dirac point and find the optimal GFET gate voltage operating bias level. In comparison, the drain-source voltage is typically of the order of 100 mV.

A drawback with using a thin gate dielectric layer is the increased possibility of defects such as pinholes in the dielectric layer which can cause gate current leakage. In laboratory measurements, a current compliance limit is usually applied to the source-measure unit (SMU) driving the gate electrode to avoid damaging the GFET in case of gate leakage. A compliance current density of 10 pA·μm$^{-2}$ has been found to be sufficiently low to prevent any damage to the GFETs; i.e. for a GFET with channel dimensions 100 μm×100 μm the maximum current allowed to flow into the gate would be 0.1 μA and the voltage is reduced before this level is exceeded.

When a large number of GFETs are arranged into an array with parallel connected gates, the probability of one or more GFETs exhibiting gate leakage becomes considerable. As an example, out of a batch of 100 samples each comprising an array of >100 GFETs with channel dimensions e.g. 50 μm×50 μm, at least one array is likely to fail due to gate leakage in at least one of the GFETs.

Certain examples disclosed herein relate to an apparatus comprising an array of FETs wherein a respective two-terminal current-limiting diode is coupled to the gate electrode of each FET. The current-limiting diodes are examples of current-limiting components.

Gate leakage currents can be very noisy (and possibly unstable), and therefore may detrimentally affect the performance of other FETs in the array. If the gates of an entire array (or sub-portion of an array) are connected in parallel to a common voltage source, a defect in the dielectric layer of one FET in the array can potentially cause all the associated FETs connected in parallel to fail. Furthermore, if a gate leakage current is noisy or unstable, this noisy current can transfer to the entire array of FETs connected in parallel with the faulty FET and reduce performance of the array.

Controlling the gating of each FET in a large array individually can significantly increase the complexity of the control circuitry and may be impractical.

FIG. 1 illustrates an apparatus 100 comprising an array of FETs 102*a-d*. In this example the FETs are QD GFETs 102*a-d*, but, in other examples may be other types of FET (this is true of other examples described herein). Each FET 102*a-d* may be termed a "pixel" or sensing element. The array of FETs 102*a-d* may be biased by connection of their respective drain electrodes 104*a-d* to a common "drain" voltage terminal $V_D$ 112 and connection of their respective gate electrodes 106*a-d* to a common "gate" voltage terminal $V_G$ 114. The FETs/pixels may be read-out by measuring the current from the source electrode 108*a-d* of each FET 102*a-d*. FIG. 1 shows each source electrode 108*a-d* connected to a respective input $V_{S\_IN1}$-$V_{S\_IN4}$ of a multiplexer MUX 110. This example does not include any two-terminal current-limiting diodes. Thus if a gate leakage current was present, for example due to a defective gate dielectric layer of one of the FETs 102*a-d*, then the performance of the other FETs 102*a-d* may be reduced due to the gate leakage current or the performance of the array 100 may fail altogether.

Figure 2A:
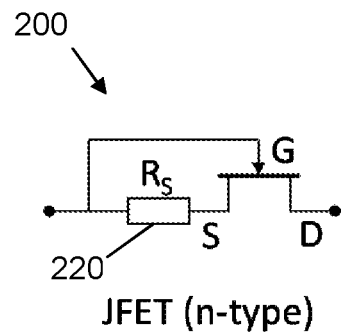
FIG. 2a shows an n-type JFET two-terminal current-limiting diode.

A constant-current diode is a two-terminal component that limits the current flowing through it to a maximum specified value. It may also be termed a two-terminal current-limiting diode. A two-terminal current-limiting diode can be achieved, for example, with an n-type JFET-transistor 200 as shown in FIG. 2*a* with the gate G shorted to the source S so that it allows current flow through the channel up to a specified level (controlled with a resistor $R_S$ 220) after which the current can no longer increase.

Figure 2B:
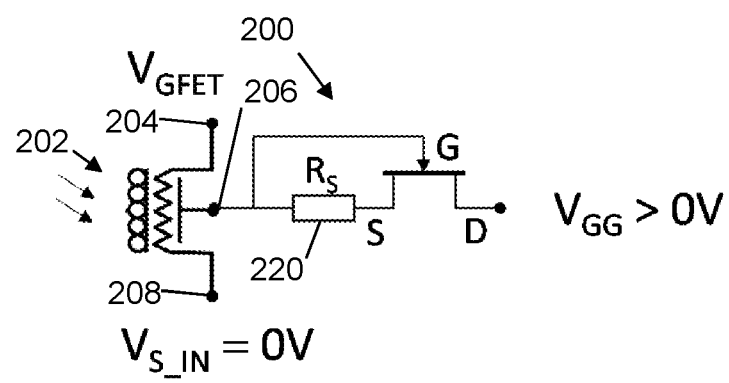
FIG. 2b shows an n-type JFET two-terminal current-limiting diode connected to a FET.
Figure 2C:
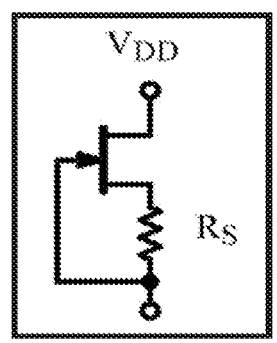
FIG. 2c shows an n-type MOSFET two-terminal current-limiting diode connected to a FET.

FIG. 2*b* shows an n-type JFET two-terminal current-limiting diode 200 connected to a FET 202. The gate 206 of the FET 202 is connected to the source S (via the resistor $R_S$ 220) and the gate G of the two-terminal current-limiting diode 200. The FET 202 in this example is shown as a QD GFET 202, but, in other examples may be a different FET/sensor. The drain $V_{GFET}$ 204 of the QD GFET 202 can be connected to a common drain terminal when the QD GFET 202 is arranged in an array parallel with other QD FETs. The source $V_{S\_IN}$ 208 of the QD GFET 204 is shown at 0V. The gate voltage applied for this configuration would be positive $V_{GG}$>0V).

A two-terminal current-limiting diode may also be similarly realised using an n-type metal-oxide-semiconductor field-effect transistor (MOSFET). A two-terminal current-limiting diode may thus comprise a gate, a source, and a drain electrode (for example, of the JFET/MOSFET), wherein the gate and source electrodes coupled together with a resistor (FIG. 2a/2c). The resistor is configured to determine the maximum allowed current flow through the two-terminal current-limiting diode.

By using a current-limiting diode which has two terminals, there is no need for any additional routing lines to connect the current-limiting diode in circuit. The circuit arrangement shown in FIG. 2b may be used for an array of FETs, as shown for example in FIG. 3, and may effectively isolate each FET gate so that if one FET exhibits gate leakage it is only that particular FET that is affected. The gate voltage for a faulty FET becomes coupled across the two-terminal current-limiting diode for that particular FET and prevents the flow of gate leakage current back to the other FETs in the array.

Figure 3:
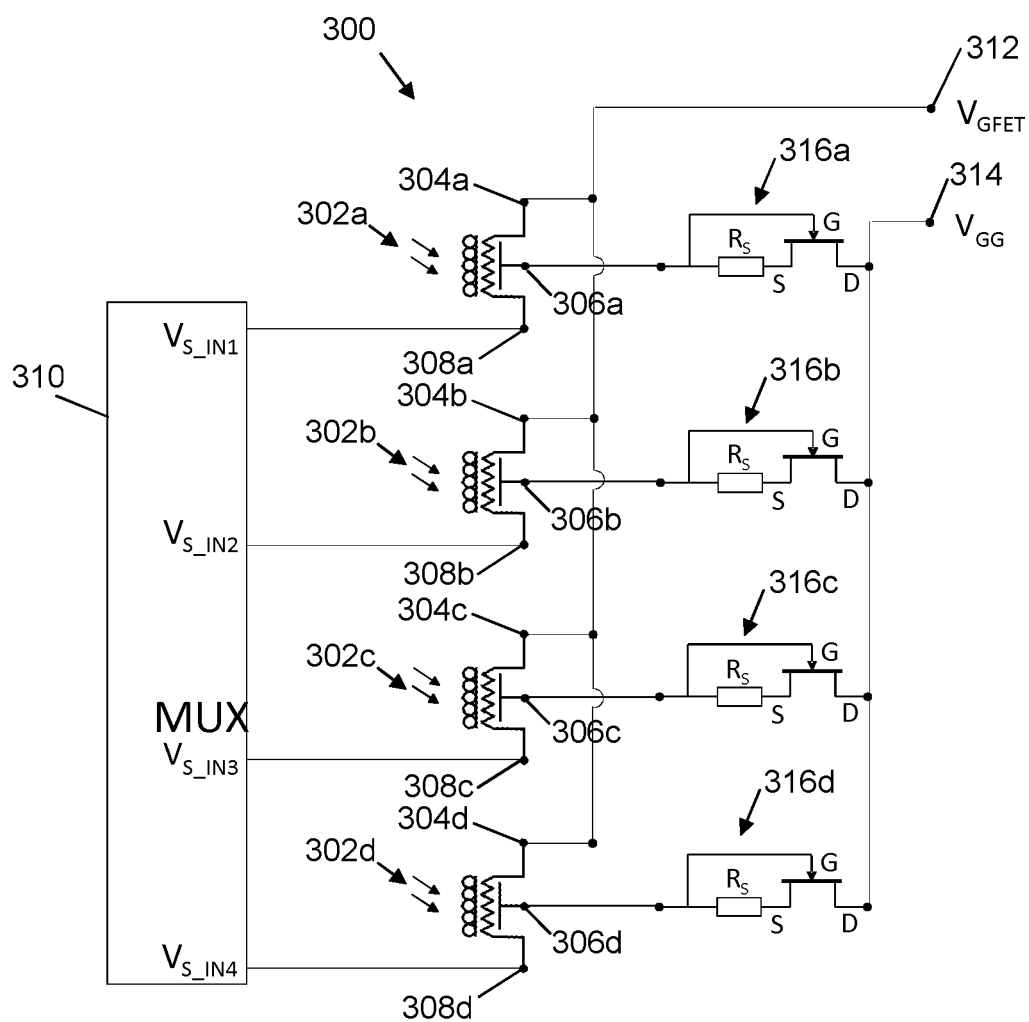
FIG. 3 shows an array of FETs connected to respective two-terminal current-limiting diodes according to the present disclosure.

FIG. 3 shows an apparatus 300 comprising an array of FETs 302a-d. Each FET 302a-d comprises a channel, source and drain electrodes 304a-d, 308a-d configured to enable a flow of electrical current through the channel, and a gate electrode 306a-d configured to enable the flow of electrical current to be varied. The gate electrode 306a-d is separated from the channel by a dielectric material configured to inhibit a flow of electrical current between the channel and gate electrode 306a-d. The gate electrode 306a-d of each FET 302a-d is connected in parallel to the gate electrodes 306a-d of the other FETs 302a-d in the array 300.

A respective two-terminal current-limiting diode 316a-d is coupled/connected to each gate electrode 306a-d of each FET 302a-d such that, in the event that a defect in the dielectric material of a particular FET 302a-d allows a leakage current to flow between the channel and gate electrode 306a-d of that FET 302a-d, the respective two-terminal current-limiting diode 316a-d limits the magnitude of the leakage current so that the other FETs 302a-d in the array are substantially unaffected by the leakage current.

The drain electrodes 304a-d of each FET 302a-d are connected to a common/shared drain terminal $V_{GFET}$ 312. The gate electrodes 306a-d are connected to a common/shared gate terminal $V_{GG}$ 314. Each two-terminal current-limiting diode 316a-d is coupled between a respective gate electrode 306a-d and the common gate terminal $V_{GG}$ 314.

The source electrodes 308a-d of the FETs 302a-d are each connected to respective inputs of a multiplexer MUX 310, the multiplexer MUX 310 configured to allow for signals from the FETs 302a-d to be read out. That is, the source electrodes 308a-d are connected as switched source outputs $V_{S\_IN1}$-$V_{S\_IN4}$ for read-out at the multiplexer MUX 310.

When $V_{GG}$ 314 is increased, the carrier charge density is modulated in the channels of each FET 302a-d. In the ideal case that none of the FETs 302a-d exhibit gate leakage, the total current flowing into $V_{GG}$ 314 will be negligibly small. However, if one or more of the FETs 302a-d have leaking gates 308a-d, the current flowing into the gates 308a-d of those FETs 302a-d will increase up to the level defined by the current limiting diode 316a-d, after which $V_{GG}$ 314 is coupled across the current limiting diode 308a-d rather than the corresponding FET 302a-d for that faulty FET. The remaining FETs 302a-d should remain unaffected by the leakage in the neighbouring FET(s) 302a-d, assuming that the set maximum gate current is significantly lower than the drain-source current. For an exemplary QD GFET sensor with channel dimensions of 100 um×100 um, the current density can be limited to e.g. 10 pA·μm$^{-2}$ so that the maximum current allowed to flow into the gate would in this case be 0.1 μA. If the QD GFET is operated with drain-source bias voltage $V_{GFET}$=100 mV, each GFET will carry a drain-source current of the order of $I_{ds}$=100 uA. As a general "design rule", the current limiting diodes can be designed so that with a given operating $V_{ds}$ voltage, the leakage current will be at least 1000 times lower than the drain-source current.

The two-terminal current-limiting diodes 200, 316a-d in FIGS. 2b and 3 are connected to the FETs 302a-d in a configuration which acts to limit the gate leakage current in the case that the gate voltage is positive with respect to the source.

Figure 4:
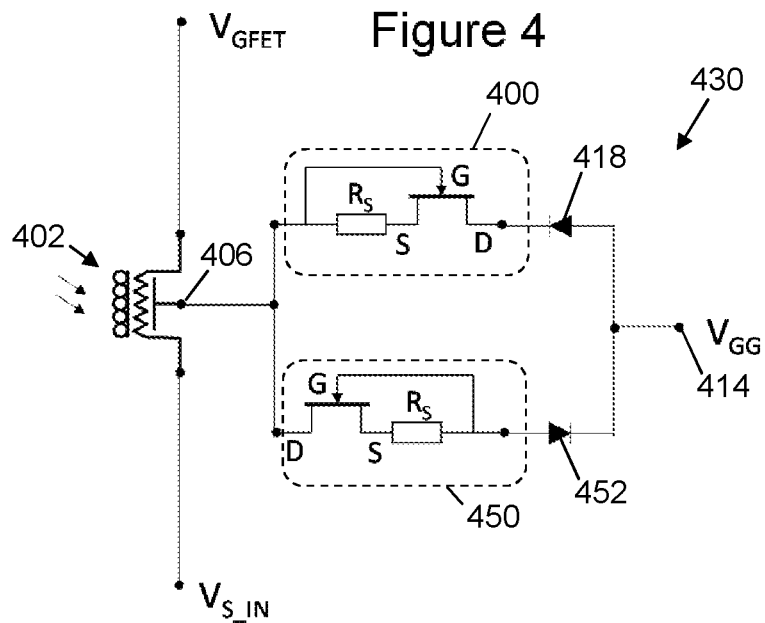
FIG. 4 shows a FET connected to two parallel two-terminal current-limiting diodes according to the present disclosure.

FIG. 4 shows a current limiting circuit 430 comprising two two-terminal current-limiting diodes 400, 450. The upper two-terminal current-limiting diode 400 is configured for positive gate voltages $V_{GG}$ similar to the two-terminal current-limiting diode 200 in FIG. 2b, and comprises a diode component 418 to indicate/determine the flow of current is permitted from the common gate terminal 414 to the FET gate 406 (i.e. a positive gate voltage $V_{GG}$). The lower two-terminal current-limiting diode 450 is configured for negative gate voltages $V_{GG}$, and comprises a diode component 452 to indicate/determine the flow of current is permitted to the common gate terminal 414 from the FET gate 406 (i.e. a negative gate voltage $V_{GG}$). This current limiting circuit 430 (which may be termed a two-terminal current-limiting diode itself) is configured to prevent gate leakage for both negative and positive gate voltages $V_{GG}$ while still remaining a two-terminal "component"/circuit without the need for additional routing circuitry.

The two-terminal current-limiting diode 430 in this example comprises first 400 and second 450 current-limiting diodes connected in parallel, the first 400 and second 450 current-limiting diodes configured to allow the leakage current to flow in opposite directions such that the magnitude of the leakage current can be limited regardless of whether positive or negative gate voltages $V_{GG}$ are applied to the gate electrode 406 of the corresponding FET 402.

Figure 5:
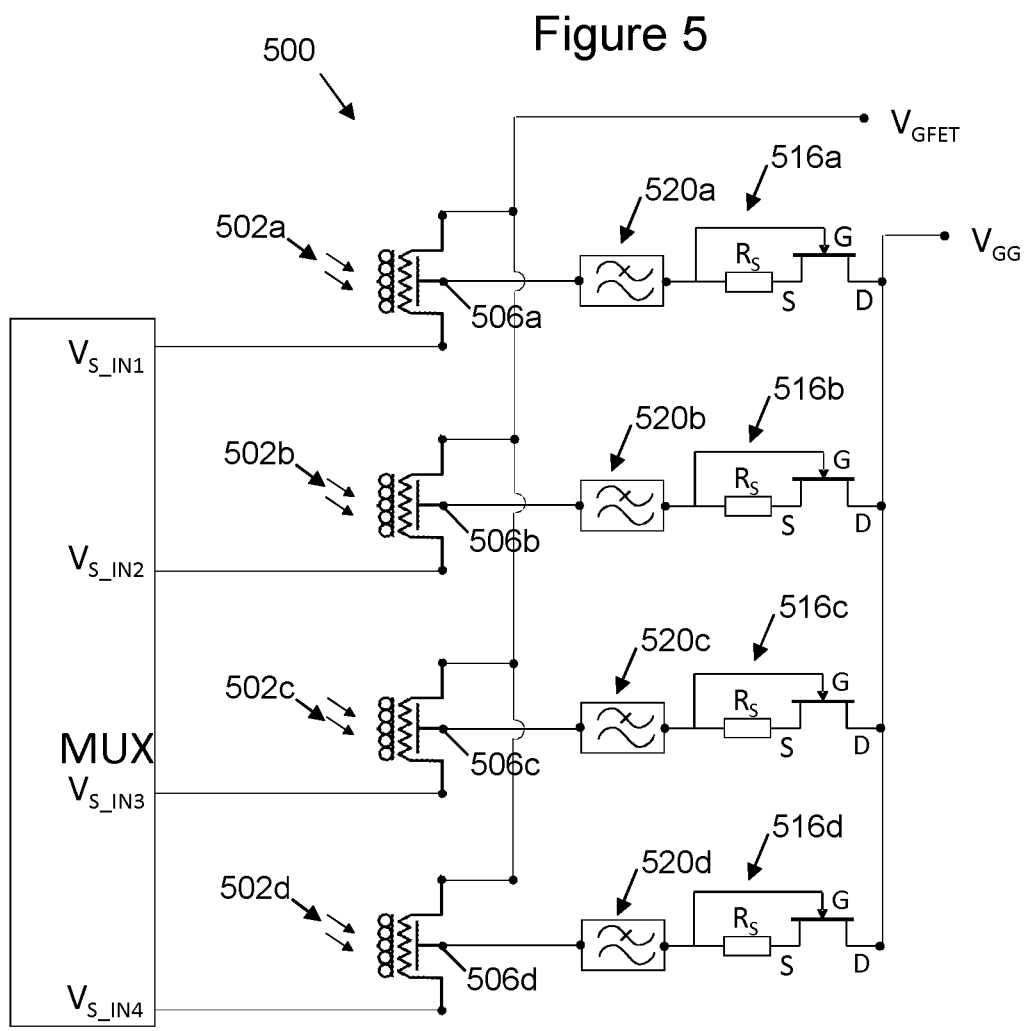
FIG. 5 shows an array of FETs connected to respective two-terminal current-limiting diodes via respective low pass filters according to the present disclosure.

In the case that one or several of the FETs in the array exhibit gate leakage, the leakage current may be extremely noisy and unstable. Hence, even when a current limiting circuit such as those discussed 200, 316a-d, 430 is introduced at the gates, the limited gate current may still introduce noise to the system. To reduce the effects of remaining noise, low-pass filters may be additionally included at the gate of each GFET as shown in FIG. 5. Elements of FIG. 5 which have already been discussed in relation to FIG. 3 will not be discussed again in detail here.

FIG. 5 shows that a respective low pass filter 520a-d may be coupled to each gate electrode 506a-d of each FET 502a-d. The respective low pass filters 520a-d are configured to reduce noise associated with the leakage current. Each low pass filter 520a-d is shown connected between the gate electrode 506a-d and the two-terminal current-limiting diode 516a-d of the respective FET 502a-d. In this example each low-pass filter 520a-d is included alongside (in series with) the associated two-terminal current-limiting diode 516a-d at the gate 506a-d of each FET 502a-d.

Figure 6:
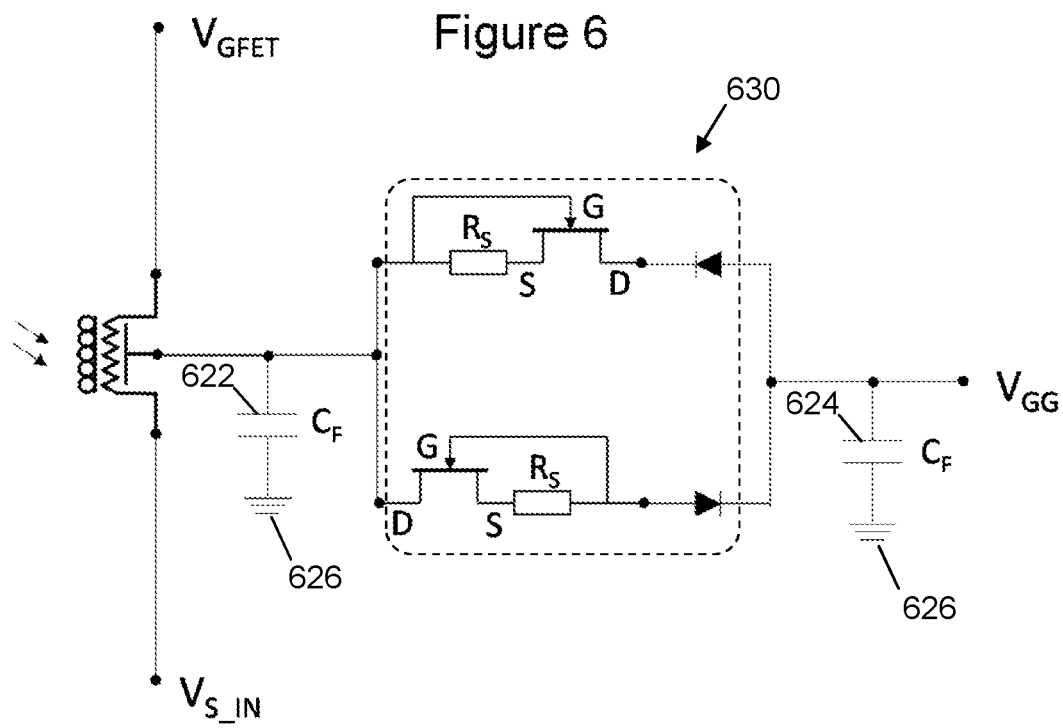
FIG. 6 shows a FET connected to two parallel two-terminal current-limiting diodes and capacitors acting as a low pass filter according to the present disclosure.

FIG. 6 illustrates that a low-pass filter may, in a simple case, be arranged by (implementing metal-insulator-metal capacitors) or using conductors 622, 624 exhibiting parasitic capacitance to the ground on both sides of the two-terminal current-limiting diode 630. Elements of FIG. 6 which have already been discussed in relation to FIG. 3 will not be discussed again in detail here. In other examples each two-terminal current-limiting diode 630 may have a conductor 622 located between the FET gate electrode and the two-terminal current-limiting diode 630, and the array may have a single conductor 624 located between the common gate voltage terminal $V_{gg}$ and all the two-terminal current-limiting diodes 630 in the array.

The conductors 622, 624 may be wide conductors, for example, so that the overlap or positioning between the conductor 622,624 and the signal ground (which is also a metal layer) is sufficiently large so that with the insulator material used (which could be for example 100 nm thick SiN) between these two conductor layers, the capacitance formed via the overlap or stray electric field, a sufficiently large capacitance is obtained to enable desired filtering. In the arrangement of FIG. 6, each conductor 622, 624 has a parasitic capacitance in relation to the signal ground 626 which is large enough to reduce the noise associated with the leakage current (i.e. filter out leakage current noise). The capacitors 622, 624 may be termed "lumped" capacitors. This term implies that it is possible to model the parasitic capacitance (which is in reality a distributed capacitance) as a single "lumped" capacitor. When signal changes are slow (low frequency) compared to time that signal changes need to travel (at speed of light) to all parts of the circuit, the capacitance of structure can be considered equal to one capacitor, and this is the case here. There is no need to consider the fact that every real-life capacitor has some dimensions and high frequency signals need some time to travel between the different parts of the capacitor.

Of course, the low pass filter conductors 626 shown in FIG. 6 in relation to a two-branch two-terminal current-limiting diode may be used in the case of a single branch two-terminal current-limiting diode as shown in FIG. 2b and FIG. 3. Similarly, the series low pass filter shown in FIG. 5 in relation to a single branch two-terminal current-limiting diode may be used in the case of a two-branch two-terminal current-limiting diode as shown in FIG. 4.

Figure 7:
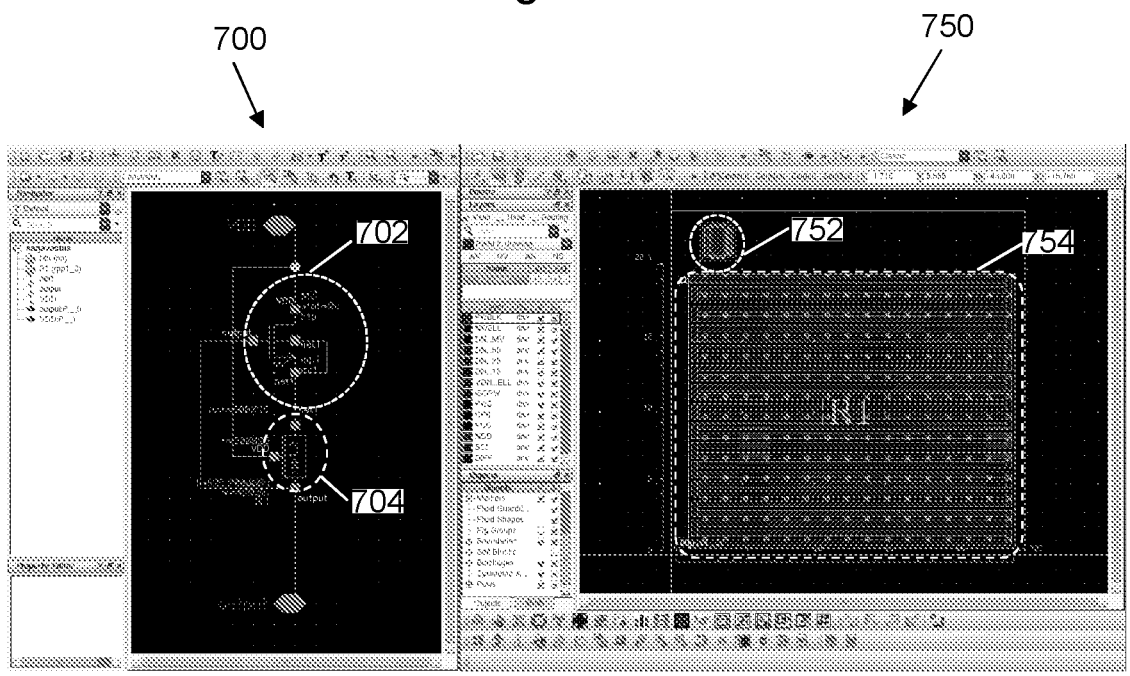
FIG. 7 shows a computer simulation of an apparatus according to the present disclosure.

FIG. 7 shows a computer simulation using XFAB process design rules using the Cadence® Virtuoso® software. The simulation uses a MOSFET two-terminal current-limiting diode. A MOSFET two-terminal current-limiting diode may filter noise very effectively, may act to maintain a very stable current with little fluctuation/noise, and may be fabricated small enough for inclusion in a single pixel as shown in FIG. 7. In some examples using MOSFET two-terminal current-limiting diodes may provide such effective noise reduction and current stability that it is not necessary to use the highest quality gate dielectric and still obtain a well-functioning array.

The left screen 700 shows a MOSFET 702 configured as a two-terminal current-limiting diode with the MOSFET gate shorted to the MOSFET source via a 500 kΩ resistor 704. The right screen 750 shows the relative dimensions of the MOSFET 752 and the resistor 754. Using a small n-type MOSFET 702, 752 (for example 1 μm×2 μm), and a 500 kΩ resistor 704, 754, the current is limited to approximately 180 nA. The size of the 500 kΩ resistor 704, 754 is approximately 20 μm×20 μm whilst the MOSFET 702, 752 is significantly smaller. The current limit level can be adjusted by tuning the resistor 704, 754 value and changing the MOSFET 702, 752 parameters.

The arrays shown in FIGS. 3 and 5 show some examples of how FETs can be arranged and read out. In further examples shown in FIGS. 8 and 9, the array of FETs can comprise bridge connected FETs (half-bridge as in FIG. 8 or full-bridge as in FIG. 9). Such bridge-arrangement arrays of FETs provide a voltage output instead of a current output as the arrays of FIGS. 3 and 5 do. That is, bridge-arrangement arrays such as those of FIGS. 8 and 9 comprise FETs which are arranged such that a change in the flow of electrical current through a FET channel is converted into a corresponding voltage signal. In the arrays comprising bridge arrangements of FETs of FIGS. 8 and 9, just as in the parallel arrays of FIGS. 3 and 5, limiting/reducing any gate leakage currents may improve the performance of the array.

Figure 8:
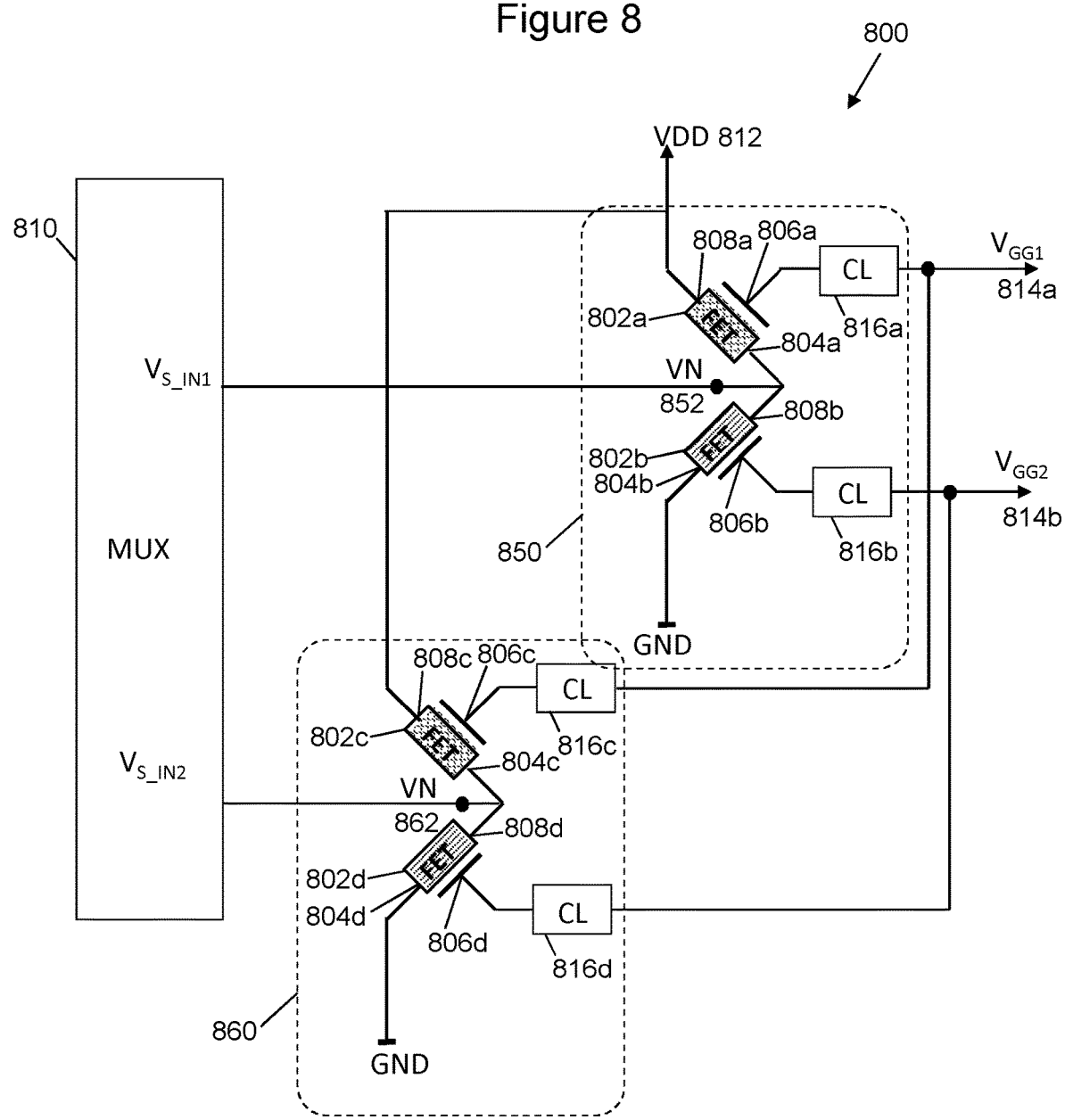
FIG. 8 shows an array of FETs connected to two-terminal current-limiting diodes in half-bridge configurations according to the present disclosure.

FIG. 8 shows an apparatus 800 comprising two half-bridge circuits 850, 860. The FETs 802a-d are arranged to form two half-bridge circuits configured to convert a change in the flow of electrical current in the channels of the FETs 802a-d of a particular half-bridge 850, 860 into a single-ended voltage signal.

Each half bridge circuit 850, 860 comprises two FETs 802a-b; 802c-d. In this example, both bridge components 802a-b; 802c-d in a half bridge are FETs and in each half-bridge, the two FETs 802a-b; 802c-d are oppositely biased. In other examples, one of the components of each half-bridge may be a resistor and the other component may be a FET. In examples as shown with oppositely biased FETs arranged in a half-bridge, since the first FET 802a, 802c exhibits an opposite response to the second FET 802b, 802d, the output signal of the half-bridge 850, 860 can be up to twice as large as a similar half-bridge circuit which is not used with oppositely biased FETs (e.g., having one FET and one resistor instead of two FETs).

Each FET 802a-d comprises a channel, source electrode 808a-d and drain electrode 804a-d configured to enable a flow of electrical current through the channel, and a gate electrode 806a-d configured to enable the flow of electrical current to be varied. The gate electrode 806a-d is separated from the channel by a dielectric material (not shown) configured to inhibit a flow of electrical current between the channel and gate electrode 806a-d.

The gate electrode 806a-d of each FET 802a-d is connected in parallel to the gate electrodes 806a-d of the other FETs 802a-d in the array 300. In this example, FETs biased in a first sense 802a, 802c have gate electrodes 806a, 806c which are connected to a common first gate terminal $V_{GG1}$ 814a. FETs biased in a second sense 802b, 802d opposite to the first sense have gate electrodes 806b, 806d which are connected to a common second gate terminal $V_{GG2}$ 814b. That is, $V_{GG1}$ 814a and $V_{GG2}$ 814b correspond to oppositely biased FETs so that as $V_{GG1}$ 814a applies a gate voltage of a first magnitude to the first FETs 802a, 802c, $V_{GG2}$ 814b may apply an equal and opposite gate voltage to the second FETs 802b, 802d.

In other examples $V_{GG1}$ 814a and $V_{GG2}$ 814b need not necessarily be equal and opposite, For example, in the case of the FETs being QD GFETs two different positive gate voltages for $V_{GG1}$ 814a and $V_{GG2}$ 814b may cause opposite optoelectronic responses due to different band alignments between the quantum dots and the channels of the FETs in the array. For example, for a QD GFET comprising a p-doped graphene channel, the optoelectronic response may vary with applied gate voltage. In an experiment with different gate dielectric thickness and material, the gate voltage was varied from 20V to 30V and then to 40V causing corresponding changes in the band-alignment between the channel and quantum dots. When a voltage of 20V was applied to the gate electrode, the band-alignment resulted in the transfer of electrons to the channel, and the remaining holes in the quantum dots caused a decrease in the source-drain current (i.e. a negative optoelectronic response). When the voltage was increased to 30V, the band-alignment flattened to allow the transfer of equal numbers of electrons and holes per unit time resulting in no net change in the source-drain current (i.e. zero optoelectronic response). When the voltage was then increased further to 40V, the band-alignment resulted in the transfer of holes to the channel, and the remaining electrons in the quantum dots caused an increase in the source-drain current (i.e. a positive optoelectronic response). The absolute voltage values mentioned here may vary according to the particular embodiments.

The VDD 812 connection of each bridge 850, 860 (in this case from source electrodes 804a and 804c) is connected to a shared drain voltage source VDD 812. However, in a bridge array configuration, it is not the drain currents which are measured (as in the arrays of FIGS. 3 and 5) but instead the output voltage of each bridge 850, 860. Therefore the bridge outputs 852, 862 are connected to the multiplexer MUX 810. The source electrode 804a of the first FET 802a and the drain electrode 808b of the second FET 802b of the first half-bridge circuit 850 are connected together at the bridge output 852 and to the MUX input $V_{S\_IN1}$. The source electrode 804c of the first FET 802c and the drain electrode 808d of the second FET 802d of the second half-bridge circuit 860 are connected together at the bridge output 862 and to the MUX input $V_{S\_IN2}$.

The ground connection of each bridge 850, 860 (in this case from source electrodes 804b and 804d) is connected to a shared circuit ground GND, as these are simply sinking the current. The source electrode 804b of the second FET 802b of the first half-bridge circuit 850, and the source electrode 804d of the second FET 802d of the second half-bridge circuit 860 are connected to ground GND.

A respective two-terminal current-limiting diode 816a-d is coupled/connected to the gate electrode 806a-d of each FET 802a-d such that, in the event that a defect in the dielectric material of a particular FET 802a-d allows a leakage current to flow between the channel and gate electrode 806a-d of that FET 802a-d, the respective two-terminal current-limiting diode 816a-d limits the magnitude of the leakage current so that the other FETs 802a-d in the array are substantially unaffected by the leakage current. Each two-terminal current-limiting diode 816a-d is coupled between a respective gate electrode 806a-d and a corresponding common gate terminal $V_{GG1}$ 814a, $V_{GG2}$ 814b.

FIG. 9 shows an apparatus 900 comprising two full-bridge circuits 950, 960. Using a full-bridge configuration can provide a differential output signal which may help to eliminate many signal disturbances, such as those arising from the supply voltage and external disturbances.

The FETs 902a-h are arranged to form one or more full-bridge circuits configured to convert a change in the flow of electrical current in the channels of the FETs 802a-h of a particular full-bridge 950, 960 into a differential voltage signal. Connections between the source and drain electrodes of the FETs 902a-h, and connections of two-terminal current-limiting diodes 916a-h to the gate electrodes of respective FETs 902a-h, are similar to those shown in FIG. 8.

The gate electrode 906a-h of each FET 902a-h is connected in parallel to the gate electrodes 906a-h of the other FETs 902a-h in the array 900. In this example, FETs biased in a first sense 902a, 902c, 902e, 902g have gate electrodes 906a, 906c, 906e, 906g which are connected to a common first gate terminal $V_{GG1}$ 914a. FETs biased in a second sense 902b, 902d, 902f, 902h opposite to the first sense have gate electrodes 906b, 906d, 906f, 906h which are connected to a common second gate terminal $V_{GG2}$ 914b. That is, $V_{GG1}$ 914a and $V_{GG2}$ 914b correspond to oppositely biased FETs so that as $V_{GG1}$ 914a applies a gate voltage of a first magnitude to the first FETs 902a, 902c, 902e, 902g, $V_{GG2}$ 914b may in some examples apply an equal and opposite gate voltage to the second FETs 902b, 902d, 902f, 902h. In other examples different positive, or different negative voltages may be applied from $V_{GG1}$ and $V_{GG12}$ respectively, as discussed above in reference to FIG. 8.

In this example there are two multiplexers (not shown)—one for the VN outputs 952, 956 and one for the VP outputs 954, 958 of the full bridge circuits 950, 960. The source electrode of the first FET 902a and the drain electrode of the second FET 902b of the first full-bridge circuit 950 are connected together at VN 952 and to the N-MUX input $V_{S\_IN1\_1\_N}$. The drain electrode of the third FET 902c and the source electrode of the fourth FET 902d of the first full-bridge circuit 950 are connected together at VP 954 and to the P-MUX input $V_{S\_IN1\_P}$. The source electrode of the first FET 902e and the drain electrode of the second FET 902f of the second half-bridge circuit 960 are connected together at VN 956 and to the N-MUX input $V_{S\_IN2\_N}$. The drain electrode of the third FET 902g and the source electrode of the fourth FET 902h of the second half-bridge circuit 960 are connected together at VP 958 and to the P-MUX input $V_{S\_IN2\_P}$.

In the full bridge array example shown in FIG. 9, reading out the voltage difference between VN 952, 956 and VP 954, 958 is achieved by routing VN and VP separately through two MUXs to a differential amplifier (not shown). In other full bridge examples VN and VP may be routed through a single MUX and the output of the MUX may be passed to a differential amplifier. In other examples, there may be a differential amplifier at each full-bridge 950, 960 (i.e. at each "pixel") and then the amplifier outputs may be routed to a MUX.

Having a differential amplifier at each pixel and then routing the amplifier output to a MUX may provide good signal quality but this configuration requires several transistors for every pixel. In some examples, the available pixel area might not be enough for several additional transistors because of the other components already present in every pixel. By routing VN and VP separately through a MUX or two MUXs to a differential amplifier, fewer transistors are required in every pixel, so this approach may be a preferred solution for smaller pixel dimensions.

Both FIGS. 8 and 9 show bridge circuits 850, 860, 950, 960 comprising first 802a, 802c; 902a, 902c, 902e, 902g and second 802b, 802d; 902b, 902d, 902f, 902h FETs which may be configured such that the interaction with a physical stimulus, e.g. light, heat, or a particular chemical species depending on the FETs used, causes an increase and decrease in the flow of electrical current through the channels of the first and second FETs respectively.

In any of the arrays discussed above, one or more of the FETs may comprise a functionalising material. The functionalising material may be configured to interact with a physical stimulus to cause a detectable change in the flow of electrical current through the channel of a FET, the change in flow of electrical current indicative of one or more of the presence and magnitude of the physical stimulus.

For example, the functionalising material of at least one of the field effect transistors may comprise a plurality of quantum dots configured to generate electron-hole pairs on exposure to incident electromagnetic radiation to produce the detectable change in the flow of electrical current through the channel. One or more of the material, size and shape of such quantum dots may be configured such that the electron-hole pairs are generated on exposure to at least one of the following types of electromagnetic radiation: x-rays, visible light, infrared, ultraviolet, radio waves, microwaves, gamma rays and thermal radiation. Such quantum dots may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

In any of the arrays discussed above, one or more of the FETS may comprise a channel which itself comprises graphene. Graphene exhibits a relatively high charge carrier mobility which is particularly sensitive to the electric field generated by the gate electrode(s) (and in the case of photosensitive functionalisation of the FET, sensitive to the photosensitiser material). In other examples, however, the channel member(s) may comprise different two-dimensional materials such as a graphene-like material (e.g. graphene oxide, phosphorene, silicone, germanene, stanine, h-BN, AlN, GaN, InN, InP, InAs, BP, BaS or GaP) or a transition metal dichalcogenide (e.g. $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ or $PtX_2$, where X=S, Se or Te).

Throughout this specification, the terms "source electrode" and "drain electrode" are used to denote electrodes at opposing sides of a channel between which charge can flow. In some examples, for example where the FETs are quantum-dot graphene FETs (QD GFETs), such devices may be described as ambipolar. The charge carriers in such an apparatus may be electrons or holes depending on, for example, back gating or chemical doping of the channel layer, and the types of charge carriers can change in use depending on how the apparatus is being used. In some examples it may be taken that the electrode labelled as the source electrode is at a lower voltage than the electrode labelled as the drain electrode.

FIG. 10 shows another example of the present apparatus 1014. The apparatus 1014 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an electromagnetic radiation sensor, a photodetector, an x-ray sensor, a chemical sensor, a heat sensor, a humidity sensor, and a module for one or more of the same. In the example shown, the apparatus 1014 comprises various components as described previously (denoted collectively by reference numeral 1015), an ammeter 1016, a voltmeter 1017, a power supply 1018, a processor 1019 and a storage medium 1020, which are electrically connected to one another by a data bus 1021.

The processor 1019 is configured for general operation of the apparatus 1014 by providing signalling to, and receiving signalling from, the other components to manage their operation. The storage medium 1020 is configured to store computer code configured to perform, control or enable operation of the apparatus 1014. The storage medium 1020 may also be configured to store settings for the other components. The processor 1019 may access the storage medium 1020 to retrieve the component settings in order to manage the operation of the other components.

Under the control of the processor 1019, the power supply 1018 is configured to apply a voltage between the source and drain electrodes of each FET in the array to enable a flow of electrical current through the respective FET channels. In addition, the power supply 918 may be configured to apply a further voltage to the gate electrode to control the movement of charge carriers in the channel of a particular FET.

The ammeter 1016 is configured to measure the electrical current through the channels of the respective FETs so that any changes in current, for example caused by external stimuli such as electromagnetic radiation, can be determined. Additionally or alternatively, the voltmeter 1017 is configured to measure the voltage signal corresponding to a change in electrical current.

The processor 1019 may be a microprocessor, including an Application Specific Integrated Circuit (ASIC). The storage medium 1020 may be a temporary storage medium such as a volatile random access memory. On the other hand, the storage medium 1020 may be a permanent storage medium such as a hard disk drive, a flash memory, or a non-volatile random access memory. The power supply 1018 may comprise one or more of a primary battery, a secondary battery, a capacitor, a supercapacitor and a battery-capacitor hybrid.

FIG. 11 shows schematically the main step 1100 of a method of making the present apparatus. The method generally comprises: coupling a respective two-terminal current-limiting diode to each gate electrode of each FET in the array such that, in the event that a defect in the dielectric material of a particular field-effect transistor allows a leakage current to flow between the channel and gate electrode of that field-effect transistor, the respective two-terminal current-limiting diode limits the magnitude of the leakage current so that the other field-effect transistors in the array are substantially unaffected by the leakage current.

FIG. 12 shows schematically the main step 1200 of a method of using the present apparatus. The method generally comprises detecting the flow of electrical current through the channel of one or more field-effect transistors of the array.

FIG. 13 illustrates schematically a computer/processor readable medium 1300 providing a computer program according to one example. The computer program may comprise computer code configured to perform, control or enable one or more of the method steps 1100 and/or 1200 of FIG. 11 or 12. In this example, the computer/processor readable medium 1300 is a disc such as a digital versatile disc (DVD) or a compact disc (CD). In other examples, the computer/processor readable medium 1300 may be any medium that has been programmed in such a way as to carry out an inventive function. The computer/processor readable medium 1300 may be a removable memory device such as a memory stick or memory card (SD, mini SD, micro SD or nano SD).

Other examples depicted in the figures have been provided with reference numerals that correspond to similar features of earlier described examples. For example, feature number 1 can also correspond to numbers 101, 201, 301 etc. These numbered features may appear in the figures but may not have been directly referred to within the description of these particular examples. These have still been provided in the figures to aid understanding of the further examples, particularly in relation to the features of similar earlier described examples.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory.

Such software/computer programs may be recorded on the same memory/processor/functional units and/or on one or more memories/processors/functional units.

In some examples, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc.), these may comprise a computer processor, Application Specific Integrated Circuit (ASIC), field-programmable gate array (FPGAS), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to different examples thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or example may be incorporated in any other disclosed or described or suggested form or example as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising an array of field-effect transistors,
    each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode,
    wherein the gate electrode of each field-effect transistor is connected in parallel to the gate electrodes of the other field-effect transistors in the array, and
    wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits magnitude of the leakage current so that the other field-effect transistors in the array are substantially unaffected by the leakage current,
    wherein each two-terminal current-limiting component comprises:
    a resistor, and either:
    an n-type junction-gate field-effect transistor, or
    an n-type metal-oxide-semiconductor field-effect transistor;
    the field-effect transistor comprising a gate, a source, and a drain electrode, the gate and source electrodes coupled together with the resistor, the resistor configured to determine maximum allowed current flow through the two-terminal current-limiting component.

2. The apparatus of claim 1, wherein each gate electrode is connected to a common gate terminal, and each two-terminal current-limiting component is coupled between a respective gate electrode and the common gate terminal.

3. The apparatus of claim 1, wherein the drain electrodes of the field-effect transistors are each connected to a common drain terminal.

4. The apparatus of claim 1, wherein the source electrodes of the field-effect transistors are each connected to respective inputs of a multiplexer, the multiplexer configured to allow for signals from the field-effect transistors to be read out.

5. The apparatus of claim 1, wherein each two-terminal current-limiting component comprises first and second current-limiting components connected in parallel, the first and second current-limiting components configured to allow the leakage current to flow in opposite directions such that the magnitude of the leakage current can be limited regardless of whether positive or negative gate voltages are applied to the gate electrode of the corresponding field-effect transistor.

6. The apparatus of claim 1, further comprising a respective low pass filter coupled to each gate electrode, the respective low pass filters configured to reduce noise associated with the leakage current.

7. The apparatus of claim 6, wherein each low pass filter is connected between the gate electrode and the two-terminal current-limiting component of the respective field-effect transistor.

8. The apparatus of claim 6, wherein each low pass filter comprises a conductor on either side of the two-terminal current-limiting component of the respective field-effect transistor, each conductor having a parasitic capacitance relative to ground which is large enough to reduce the noise associated with the leakage current.

9. The apparatus of claim 1, wherein each field-effect transistor in the array comprises a functionalising material configured to interact with a physical stimulus to cause a detectable change in the flow of electrical current through the channel which is indicative of one or more of the presence and magnitude of the physical stimulus.

10. The apparatus of claim 9, wherein the field-effect transistors in the array are arranged such that the change in the flow of electrical current is converted into a corresponding voltage signal.

11. The apparatus of claim 10, wherein the field-effect transistors in the array are arranged to form one or more half-bridge circuits configured to convert the change in the flow of electrical current into a single-ended voltage signal.

12. The apparatus of claim 10, wherein the field-effect transistors in the array are arranged to form one or more full-bridge circuits configured to convert the change in the flow of electrical current into a differential voltage signal.

13. The apparatus of 11, wherein each bridge circuit comprises first and second field-effect transistors configured such that the interaction with the physical stimulus causes an increase and decrease in the flow of electrical current through the channels of the first and second field-effect transistors respectively.

14. The apparatus of claim 1, wherein the apparatus is one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a photodetector, a chemical sensor, a heat sensor, a humidity sensor, and a module for one or more of the same.

15. An apparatus comprising an array of field-effect transistors,
each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode, and
a respective low pass filter coupled to each gate electrode, the respective low pass filters configured to reduce noise associated with the leakage current,
wherein the gate electrode of each field-effect transistor is connected in parallel to the gate electrodes of the other field-effect transistors in the array, and
wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits magnitude of the leakage current so that the other field-effect transistors in the array are substantially unaffected by the leakage current.

16. The apparatus of claim 15, further comprising a respective low pass filter coupled to each gate electrode, the respective low pass filters configured to reduce noise associated with the leakage current.

17. The apparatus of claim 15, wherein each low pass filter is connected between the gate electrode and the two-terminal current-limiting component of the respective field-effect transistor.

18. An apparatus comprising an array of field-effect transistors,
each field-effect transistor comprising a channel, source and drain electrodes configured to enable a flow of electrical current through the channel, and a gate electrode configured to enable the flow of electrical current to be varied, the gate electrode separated from the channel by a dielectric material configured to inhibit a flow of electrical current between the channel and gate electrode,
wherein the gate electrode of each field-effect transistor is connected in parallel to the gate electrodes of the other field-effect transistors in the array, and
wherein a respective two-terminal current-limiting component is coupled to each gate electrode such that, in the event that a defect in the dielectric material of a particular field-effect transistor allows a leakage current to flow between the channel and gate electrode of that field-effect transistor, the respective two-terminal current-limiting component limits magnitude of the leakage current so that the other field-effect transistors in the array are substantially unaffected by the leakage current,
wherein each two-terminal current-limiting component comprises first and second current-limiting components connected in parallel, the first and second current-limiting components configured to allow the leakage current to flow in opposite directions such that the magnitude of the leakage current can be limited regardless of whether positive or negative gate voltages are applied to the gate electrode of the corresponding field-effect transistor.

19. The apparatus of claim 18, further comprising a respective low pass filter coupled to each gate electrode, the respective low pass filters configured to reduce noise associated with the leakage current.

20. The apparatus of claim 19, wherein each low pass filter is connected between the gate electrode and the two-terminal current-limiting component of the respective field-effect transistor.

* * * * *